US007782623B2

(12) United States Patent
Liu

(10) Patent No.: US 7,782,623 B2
(45) Date of Patent: Aug. 24, 2010

(54) HEAT DISSIPATION DEVICE

(75) Inventor: Jin-Biao Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/392,082

(22) Filed: Feb. 24, 2009

(65) Prior Publication Data

US 2010/0053906 A1 Mar. 4, 2010

(30) Foreign Application Priority Data

Aug. 27, 2008 (CN) ........................ 2008 1 0304241

(51) Int. Cl.
*H05K 7/20* (2006.01)
*G06F 1/20* (2006.01)

(52) U.S. Cl. .................. 361/719; 361/679.54; 361/704; 361/709; 165/80.2; 165/185; 174/16.3

(58) Field of Classification Search ............ 361/679.46, 361/679.54, 690, 702–704, 709–710, 719; 165/80.2–80.3, 185; 174/16.3

See application file for complete search history.

(56) References Cited

U.S. PATENT DOCUMENTS

| | | | | |
|---|---|---|---|---|
| 6,480,387 | B1 * | 11/2002 | Lee et al. | 361/704 |
| 7,019,979 | B2 * | 3/2006 | Wang et al. | 361/719 |
| 7,310,229 | B2 * | 12/2007 | Lee et al. | 361/697 |
| 7,321,492 | B2 * | 1/2008 | Wang et al. | 361/709 |
| 7,342,796 | B2 * | 3/2008 | Aukzemas | 361/719 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipation device for dissipating heat generated by an electronic device on a printed circuit board includes a heat sink and a plurality of mounting devices. A plurality of retaining pillars are secured on the printed circuit board at positions around the electronic device. Each of the mounting devices includes a fixing portion connecting with the heat sink, a mounting portion extending from the fixing portion and a locating portion extending from the mounting portion to a position below the mounting portion. The retaining pillars on the printed circuit board extend through the locating portions and abut against bottoms of the mounting portions to accurately position the heat dissipation device on the electronic device on the circuit board before fasteners are brought to extend through the mounting portions to screw in the retaining pillars.

16 Claims, 3 Drawing Sheets

HEAT DISSIPATION DEVICE

BACKGROUND OF THE INVENTION

1. Field of the Invention

The disclosure relates generally to heat dissipation devices, and more particularly to a heat dissipation device that has a locating structure for facilitating an assembly of the heat dissipation device to a printed circuit board.

2. Description of Related Art

With development in computer technology, electronic devices operate at high speed. It is well known that the higher speed the electronic devices operate at, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Conventionally, in order to keep the heat dissipation device intimately contacting with the electronic device mounted on a printed circuit board (PCB), a securing mechanism is utilized to secure the heat dissipation device to the PCB. The heat dissipation device includes a heat sink and a plurality of flanges extending from a circumferential periphery of the heat sink. The flanges each define a through hole for extension of a screw therethrough. A plurality of retaining pillars each having a threaded hole defined therein, is provided at the PCB, surrounding the electronic device. The through holes of the flanges are in alignment with the threaded holes of the retaining pillars, respectively. In assembly, a plurality of screws extends through the through holes of the flanges and further engages in the threaded holes of the retaining pillars of the PCB, respectively, thereby securing the heat dissipation device to the PCB. However, it is difficult to make the through holes of the flanges of the heat dissipation device completely be in alignment with the threaded holes of the retaining pillars of the PCB, when mounting the heat dissipation device on the PCB. Thus, the efficiency of mounting the heat dissipation device on the PCB is low. Furthermore, when initially screwing the first one of the flanges of the heat dissipation device to a corresponding retaining pillar of the PCB, the rotating screw may bring the flange and accordingly the whole heat dissipation device to rotate together about the screw. Such rotation of the heat dissipation device is extremely undesirable, since other devices around the PCB may be damaged by the rotated heat dissipation device.

What is needed, therefore, is a heat dissipation device which can overcome the above disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
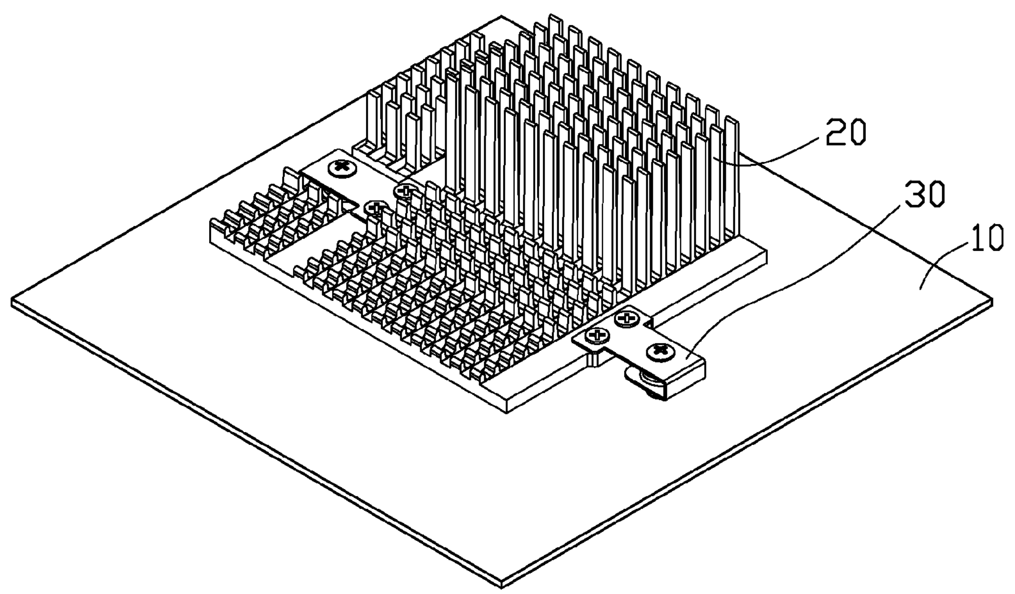
FIG. 1 is an assembled view of a heat dissipation device in accordance with an embodiment of disclosure, with a printed circuit board located below the heat dissipation device.
Figure 2:
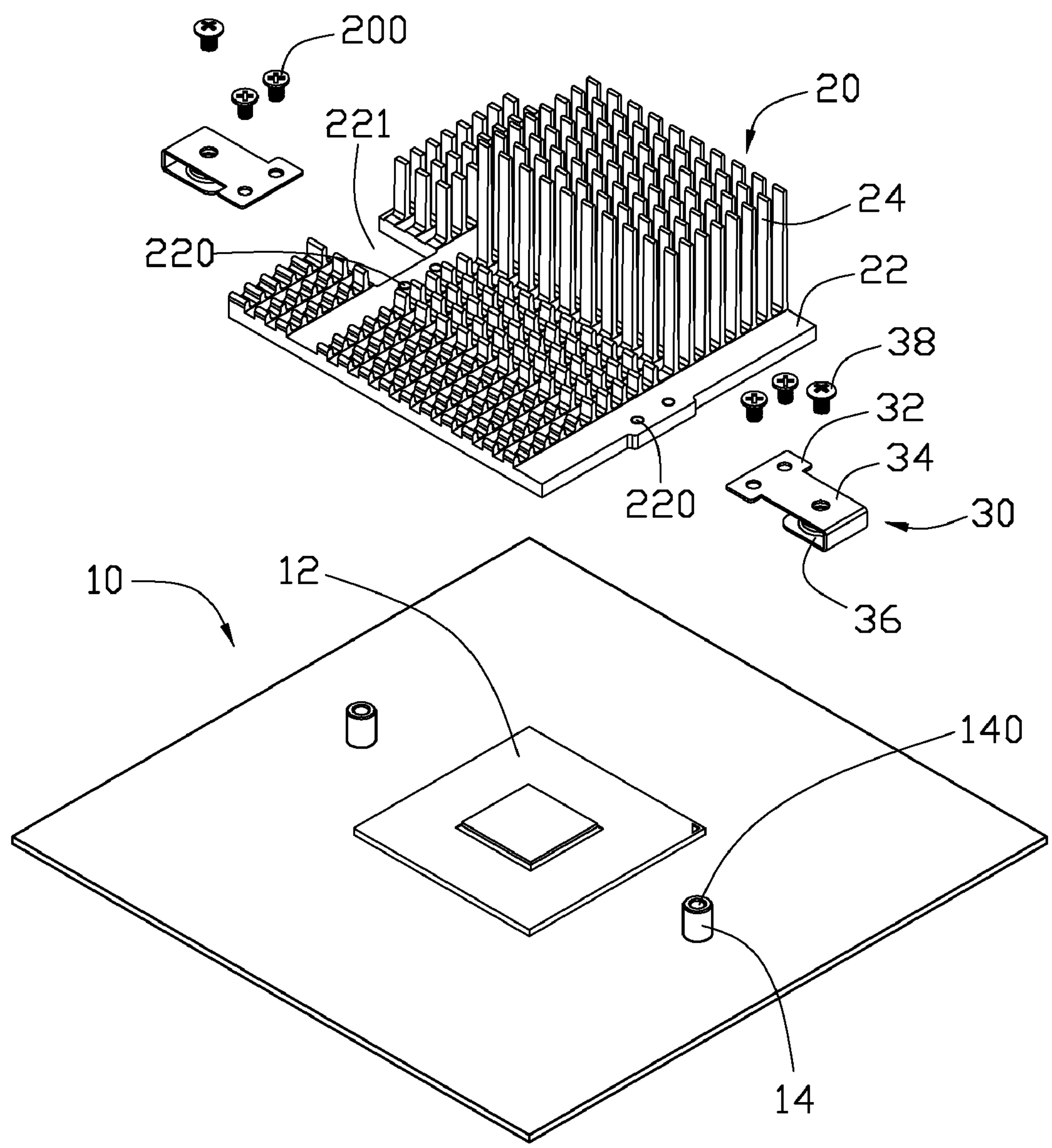
FIG. 2 is an exploded view of the heat dissipation device of FIG. 1, separated from the printed circuit board.

Referring to FIGS. 1-2, a heat dissipation device in accordance with an embodiment of disclosure is for dissipating heat from an electronic device 12 mounted on a printed circuit board (PCB) 10. The heat dissipation device includes a heat sink 20 contacting with the electronic device 12 and two mounting devices 30 mounted on two opposite sides of a base plate 22 of the heat sink 20 and securing the heat sink 20 onto the PCB 10.

Two retaining pillars 14, corresponding to the two mounting devices 30, are secured on the PCB 10 at positions near two opposite sides of the electronic device 12. The two retaining pillars 14 each define a threaded hole 140 in a center thereof.

The heat sink 20 is made of a metal having a high heat conductivity, such as aluminum or copper. The heat sink 20 includes the base plate 22 and a plurality of fins 24 extending vertically and upwardly from a top surface of the base plate 22. The base plate 22 defines a rectangular cutout 221 at a first lateral side thereof for receiving one mounting device 30 therein and defines a pair of threaded holes 220 near the cutout 221. The base plate 22 has a protrusion (not labeled) extending from a second lateral side thereof opposite to the first lateral side and defines another pair of threaded holes 220 adjacent to the protrusion and opposite to the cutout 221.

Figure 3:
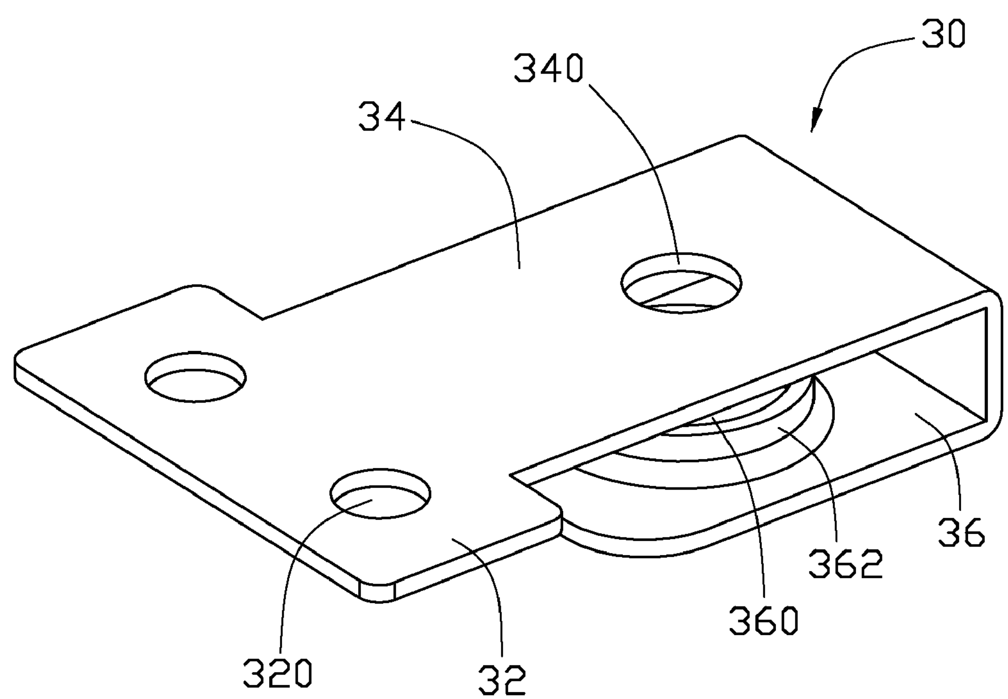
FIG. 3 is an enlarged view of a mounting device of the heat dissipation device of FIG. 2.

Also referring to FIG. 3, the two mounting devices 30 each are integrally formed from a sheet metal and include a rectangular fixing portion 32, a rectangular mounting portion 34 extending horizontally and outwardly from a center of a side of the fixing portion 32, and a locating portion 36 extending from an end of the mounting portion 34 to a position below the mounting portion 34. The fixing portion 32 and the mounting portion 34 cooperatively define a T-shaped configuration. Each fixing portion 32 defines two through holes 320 near two ends thereof for matching with a corresponding pair of the threaded holes 220 at the lateral side of the heat sink 20. Each mounting portion 34 defines a through hole 340, corresponding to the threaded hole 140 of the retaining pillar 14 of the PCB 10, for extension of a fastener 38 therethrough. Each locating portion 36 defines a locating hole 360 in a center thereof, in alignment with the through hole 340 of the mounting portion 34. An inner circumference of the locating portion 36 around the locating hole 360 is bent upwardly and forms a locating sleeve 362. A diameter of the through hole 340 of the mounting portion 34 is smaller than an inner diameter of the locating sleeve 362 of the locating portion 36 and an outer diameter of the retaining pillar 14, whereby after extending through the locating sleeve 362 of the locating portion 36, the retaining pillar 14 of the PCB 10 would abut against a bottom of the mounting portion 34. The inner diameter of the locating sleeve 362 is slightly larger than the outer diameter of the retaining pillar 14 of the PCB 10, whereby the retaining pillar 14 of the PCB 10 can be fittingly received in the locating sleeve 362.

In assembly, four screws 200 are brought to extend through the through holes 320 of the fixing portions 32 of the two mounting devices 30 and are driven to threadedly engage with the two pairs of the threaded holes 220 of the base plate 22 of the heat sink 20 to thereby fix the two mounting devices 30 at the two lateral sides of the heat sink 20. The heat dissipation device is placed on the printed circuit board 10 by the guidance of the two retaining pillars 14 through the locating sleeves 362 of the mounting devices 30. The two retaining pillars 14 of the PCB 10 are thus received in the locating sleeves 362 of the locating portions 36 and abut against the bottom of the mounting portions 34. The two fasteners 38 are brought to extend through the through holes 340 of the mounting portions 34 of the mounting devices 30 and engage in the threaded holes 140 of the two retaining pillars 14 of the PCB 10. Thus, the heat dissipation device is mounted on the PCB 10 and have an intimate contact with the electronic device 12.

According to the disclosure, the locating portions 36 of the two mounting devices 30 can guide the threaded holes 140 of the two retaining pillars 14 of the PCB 10 to be in alignment with the through holes 340 of the mounting portions 34 of the two mounting devices 30, thereby to overcome the disadvantage that it is difficult to accurately position the heat dissipation device to the retaining pillars 14 of the PCB 10. Further, by the engagement and preassembly between the two retaining pillars 14 and the two sleeves 362, the heat dissipation device would not rotate when screwing the fasteners 38 through the mounting devices 30 into the retaining pillars 14, thereby eliminating the possibility of damage of other electronic devices (not shown) of the PCB 10 due to the rotation of the heat dissipation device.

It is believed that disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for dissipating heat generated by an electronic device mounted on a printed circuit board, a plurality of retaining pillars being secured on the printed circuit board, each pillar defining a threaded hole therein, the heat dissipation device comprising:

a heat sink; and a plurality of mounting devices mounted on a periphery of the heat sink, each of the mounting devices comprising a fixing portion connecting with the heat sink, a mounting portion extending from the fixing portion and a locating portion extending from the mounting portion to a position below the mounting portion, wherein when the heat dissipation device is mounted on the electronic device, a corresponding retaining pillar on the printed circuit board extends through the locating portion of each mounting device to guide the heat dissipation device to be mounted in position on the electronic device on the printed circuit board, and the locating portion being substantially parallel to the mounting portion.

2. The heat dissipation device as claimed in claim 1, wherein the heat sink includes a base plate and a plurality of fins extending from the base plate, the fixing portions of the mounting devices being attached to a top of the base plate.

3. The heat dissipation device as claimed in claim 2, wherein each of the fixing portions of the mounting devices defines a plurality of through holes, the base plate defining a plurality of threaded holes, a plurality of screws extending through the through holes of the fixing portions into the threaded holes of the base plate to secure the fixing portions to the base plate.

4. The heat dissipation device as claimed in claim 2, wherein the base plate defines a cutout at a lateral side thereof, one of the fixing portions of the mounting devices being accommodated in the cutout of the base plate.

5. The heat dissipation device as claimed in claim 1, wherein each mounting portion defines a through hole therein, each locating portion defining a locating hole in alignment with the through hole of each mounting portion, the locating hole having a diameter larger than that of the through hole.

6. The heat dissipation device as claimed in claim 5, wherein an inner edge of each location portion around the locating hole thereof is bent upwardly to form a locating sleeve.

7. The heat dissipation device as claimed in claim 5, wherein each retaining pillar on the printed circuit board extends through the locating hole of the locating portion and abuts against a bottom of the mounting portion of a corresponding mounting device, and each retaining pillar on the printed circuit board is in alignment with the through hole of the mounting portion of the corresponding mounting device.

8. The heat dissipation device as claimed in claim 7, wherein further including a plurality of fasteners extending through the through holes of the mounting portions of the mounting devices and engaging in the threaded holes of the retaining pillars on the printed circuit board.

9. The heat dissipation device as claimed in claim 6, wherein the diameter of the through hole of each mounting portion is smaller than an inner diameter of the locating sleeve of each locating portion.

10. The heat dissipation device as claimed in claim 9, wherein the inner diameter of each locating sleeve is larger than an outer diameter of each retaining pillar on the PCB.

11. The heat dissipation device as claimed in claim 2, wherein each of the mounting devices is a single piece and integrally formed by bending a sheet metal.

12. An electronic device comprising:

a printed circuit board having a plurality of retaining pillars formed thereon;

an electronic component mounted on the printed circuit board and between the retaining pillars;

a heat sink mounted on the electronic component to absorb heat therefrom; and a plurality of mounting devices mounted on a periphery of the heat sink, each of the mounting devices comprising a fixing portion connecting with the heat sink, a mounting portion extending from the fixing portion and a locating portion extending from the mounting portion, wherein the retaining pillars of the printed circuit board extend through the locating portions of the mounting devices to abut the mounting portions of the mounting devices, whereby the locating portions of the mounting devices guide the retaining pillars of the printed circuit board to be in alignment with the mounting portions of the mounting devices to preassemble the heat dissipation device in position on the electronic component on the printed circuit board and the locating portion being substantially parallel to the mounting portion.

13. The electronic device as claimed in claim 12, wherein each mounting portion defines a through hole therein, each locating portion defining a locating hole in alignment with the through hole of each mounting portion.

14. The electronic device as claimed in claim 13, wherein an inner edge of each locating portion around the locating hole thereof is bent upwardly to form a locating sleeve.

15. The electronic device as claimed in claim 14, wherein each retaining pillar on the printed circuit board is received in the locating sleeve of the locating portion of a corresponding mounting device and is in alignment with the through hole of the mounting portion of the corresponding mounting device.

16. The electronic device as claimed in claim 12, wherein the mounting portion of each mounting device is located above the locating portion thereof.

* * * * *